(12) United States Patent
Liu et al.

(10) Patent No.: US 9,946,829 B2
(45) Date of Patent: Apr. 17, 2018

(54) METHODS FOR REDISTRIBUTING CELL DENSITIES IN LAYOUT AREA OF IC

(71) Applicant: MediaTek Inc., Hsin-Chu (TW)

(72) Inventors: Shih-Ying Liu, Taipei (TW); Chin-Hsiung Hsu, Taoyuan (TW); Chi-Yuan Liu, Taichung (TW); Chun-Chih Yang, New Taipei (TW); Chao-Neng Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 211 days.

(21) Appl. No.: 14/932,165

(22) Filed: Nov. 4, 2015

(65) Prior Publication Data

US 2016/0232272 A1    Aug. 11, 2016

Related U.S. Application Data

(60) Provisional application No. 62/113,602, filed on Feb. 9, 2015.

(51) Int. Cl.
*G06F 17/50* (2006.01)

(52) U.S. Cl.
CPC ...... *G06F 17/5072* (2013.01); *G06F 17/5077* (2013.01)

(58) Field of Classification Search
CPC ............. G06F 17/5045; G06F 17/5068; G06F 17/5072; G06F 17/5077; G06F 17/5081
USPC .......................... 716/110, 119, 122, 126, 135
See application file for complete search history.

(56) References Cited

U.S. PATENT DOCUMENTS

| | | | | |
|---|---|---|---|---|
| 2003/0233625 A1* | 12/2003 | Brazell | ............... | G06F 17/5068 716/119 |
| 2006/0156265 A1* | 7/2006 | Tang | .................. | G06F 17/5072 716/122 |
| 2008/0005712 A1* | 1/2008 | Charlebois | .......... | G06F 17/5072 716/122 |
| 2009/0113368 A1* | 4/2009 | Lin | ..................... | G06F 17/5068 716/122 |

* cited by examiner

*Primary Examiner* — Paul Dinh
(74) *Attorney, Agent, or Firm* — McClure, Qualey & Rodack, LLP (57) ABSTRACT

A method for redistributing cell densities in layout of IC is provided. Initial cell density distribution and routing density distribution are obtained in an initial placement of the IC. White space is inserted into the initial placement according to a specific density value, so as to flatten the initial cell density distribution to the specific density value and obtain a flat cell density distribution. The specific density value is larger than a maximum cell density value within the initial cell density distribution. Cell densities of a first region are increased in the IC according to the routing density distribution and the flat cell density distribution, so as to obtain a modified cell density distribution. The modified cell density distribution is smoothed to obtain a calibrated cell density distribution. The white space is removed from the calibrated cell density distribution to obtain a final placement.

16 Claims, 7 Drawing Sheets

METHODS FOR REDISTRIBUTING CELL DENSITIES IN LAYOUT AREA OF IC

CROSS REFERENCE TO RELATED APPLICATIONS

This application claims priority of U.S. Provisional Application No. 62/113,602, filed on Feb. 9, 2015, the entirety of which is incorporated by reference herein.

BACKGROUND OF THE INVENTION

Field of the Invention

The invention relates to a method for redistributing cell densities in layout area of an integrated circuit (IC), and more particularly to a method for redistributing cell densities in layout area of an IC to reduce congestion regions and layout area.

Description of the Related Art

In recent years, the development process of integrated circuits (ICs) such as super larger scale integrated circuits (LSIs) has generally utilized computer assisted design (CAD). According to a development process based on CAD, abstract circuit data, which corresponds to functions of an integrated circuit to be developed, is defined by using a so-called hardware description language (HDL), and the defined circuit is used to form a concrete circuit structure to be mounted on a chip.

Before the IC chips are manufactured (or implemented), the placement and the layout area of the IC chips are considered first so as to determine the die size of each IC chip. In general, the die size will affect the manufacturing cost for the IC chip. Therefore, it is desirable to optimize the placements of an IC chip for minimizing the layout area of the IC chip.

BRIEF SUMMARY OF THE INVENTION

Methods for redistributing cell densities in a layout of an integrated circuit and non-transitory computer-readable storage mediums storing instructions are provided. An embodiment of a method for redistributing cell densities in a layout of an integrated circuit is provided. An initial cell density distribution is obtained in an initial placement of the IC. A routing density distribution is obtained in the initial placement of the IC. White space is inserted into the initial placement according to a specific density value, so as to flatten the initial cell density distribution to the specific density value and obtain a flat cell density distribution, wherein the specific density value is larger than a maximum cell density value within the initial cell density distribution. Cell densities of a first region are increased in the IC according to the routing density distribution and the flat cell density distribution, so as to obtain a modified cell density distribution. The modified cell density distribution is smoothed to obtain a calibrated cell density distribution. The white space is removed from the calibrated cell density distribution to obtain a final placement. The IC is implemented according to the final placement.

Furthermore, another embodiment of a method for redistributing cell densities in a layout area of an IC is provided. An initial cell density distribution is obtained in an initial placement of the IC. Cell densities of the initial placement are flattened according to the initial cell density distribution. At least one first region is identified in the IC according to the initial placement with the flattened cell densities, wherein the first region has a high routing density. A plurality of first cells are expanded in the first region, so as to increase the cell sizes of the first cells. A plurality of second cells are shrunk outside the first region, so as to decrease the cell sizes of the second cells. The cell densities of the initial placement are redistributed according to the expanded first cells and the shrunken second cells, so as to obtain a calibration placement. The cell sizes of the first and second cells are recovered in the calibration placement, to obtain a final placement. The IC is implemented according to the final placement.

Moreover, an embodiment of a non-transitory computer-readable storage medium storing instructions that, when executed by a computer, cause the computer to perform a method for redistributing cell densities in a layout area of an IC is provided. An initial cell density distribution is obtained in an initial placement of the IC. A routing density distribution is obtained in the initial placement of the IC. White space is inserted into the initial placement according to a specific density value, so as to flatten the initial cell density distribution to the specific density value and obtain a flat cell density distribution, wherein the specific density value is larger than a maximum cell density value within the initial cell density distribution. Cell densities of a first region are increased in the IC according to the routing density distribution and the flat cell density distribution, so as to obtain a modified cell density distribution. The modified cell density distribution is smoothed to obtain a calibrated cell density distribution. The white space is removed from the calibrated cell density distribution to obtain a final placement. The IC is implemented according to the final placement.

Furthermore, another embodiment of a non-transitory computer-readable storage medium storing instructions that, when executed by a computer, cause the computer to perform a method for redistributing cell densities in a layout area of an IC is provided. An initial cell density distribution is obtained in an initial placement of the IC. Cell densities of the initial placement are flattened according to the initial cell density distribution. At least one first region is identified in the IC according to the initial placement with the flattened cell densities, wherein the first region has a high routing density. A plurality of first cells are expanded in the first region, so as to increase cell sizes of the first cells. A plurality of second cells are shrunk outside the first region, so as to decrease cell sizes of the second cells. The cell densities of the initial placement are redistributed according to the expanded first cells and the shrunken second cells, so as to obtain a calibration placement. The cell sizes of the first and second cells are recovered in the calibration placement, to obtain a final placement. The IC is implemented according to the final placement.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
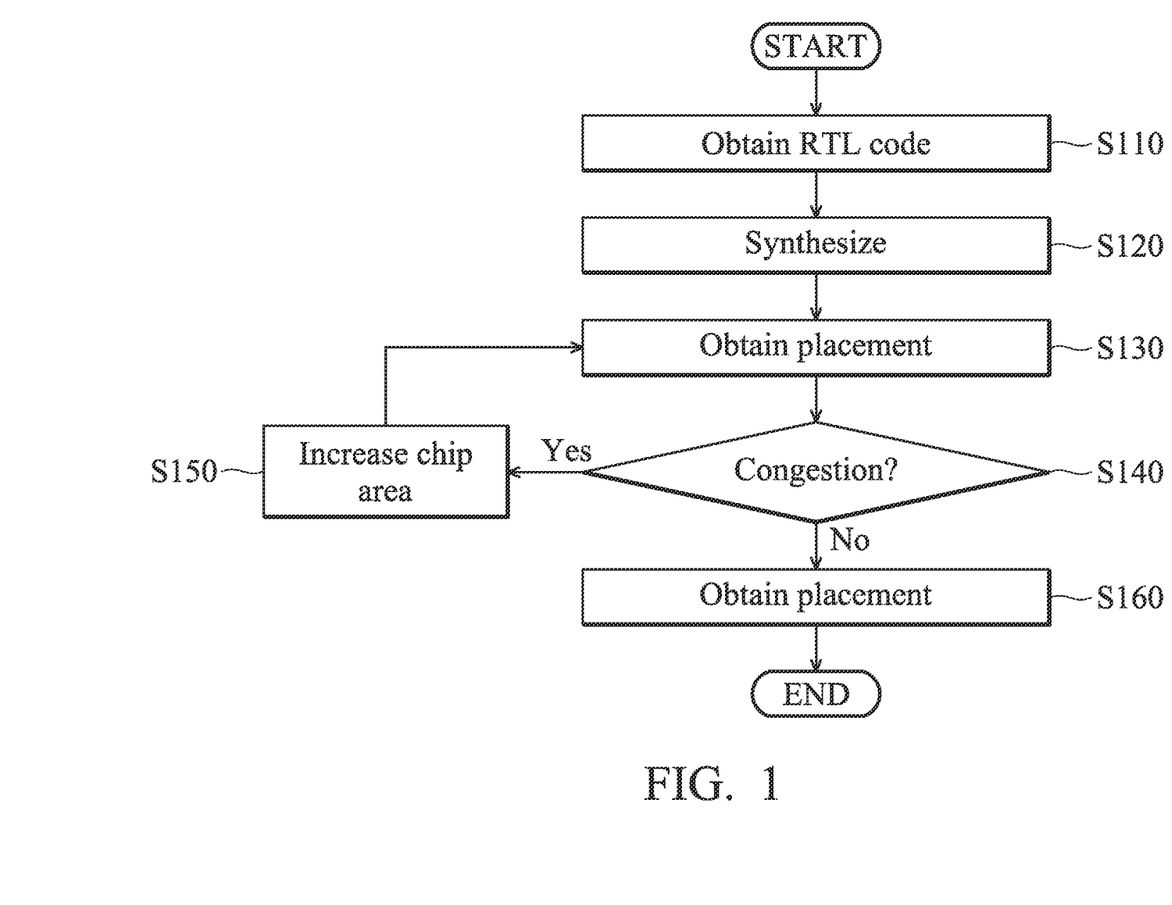
FIG. 1 shows a flow chart illustrating a typical hierarchical design process of an integrated circuit (IC)

FIG. 1 shows a flow chart illustrating a typical hierarchical design process of an integrated circuit (IC). First, in step S110, a register-transfer-level (RTL) code describing the function performed by the IC is obtained. Next, in step S120, the RTL code is synthesized to generate gates for the IC. Next, in step S130, an auto place and route (APR) procedure is performed to generate a placement of the gates within a chip area of the IC. Next, it is checked whether there is any congestion in the placement (step S140). If there is no congestion, the IC is implemented according to the placement (step S160). If there is congestion, the chip area of the IC must be increased to handle the congestion (step S150), and then the APR procedure is performed again (step S130), so as to generate a new placement of the gates within the increased chip area of the IC.

Figure 2:
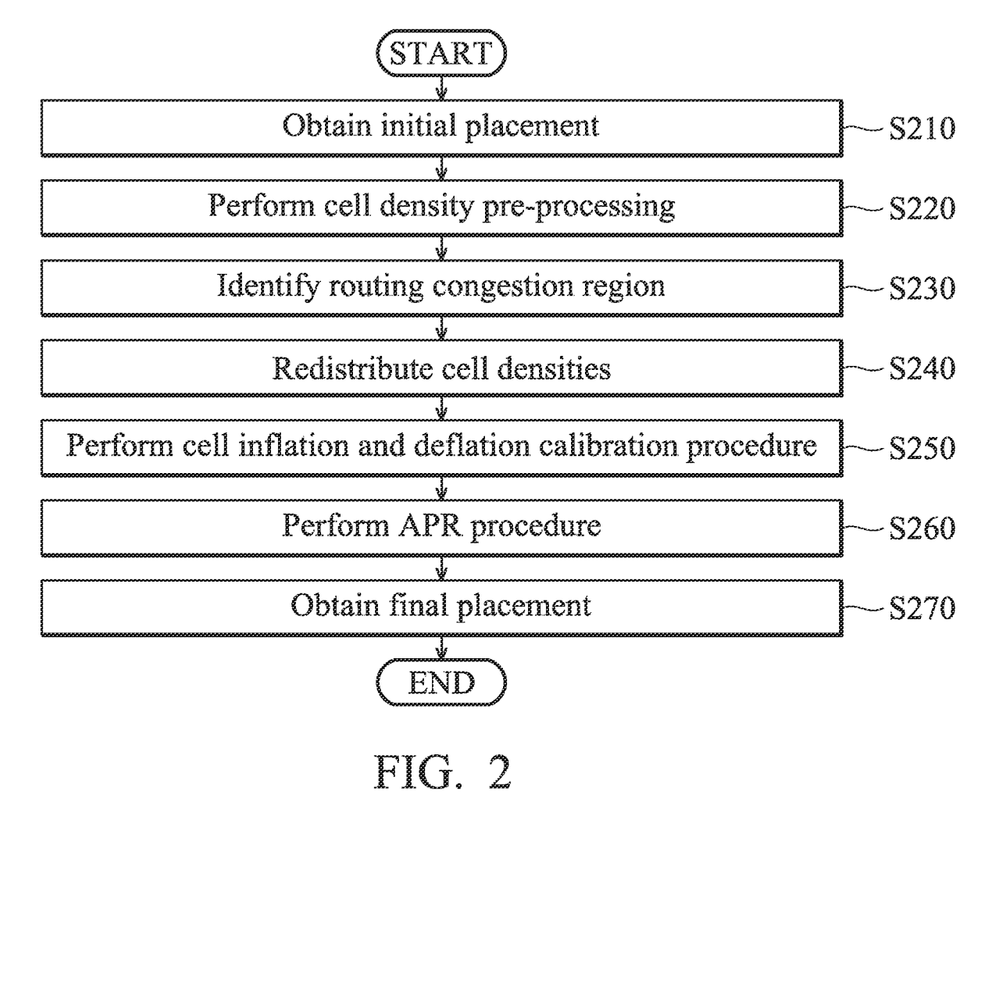
FIG. 2 shows a method for redistributing cell densities in a layout of an IC according to an embodiment of the invention

FIG. 2 shows a method for redistributing cell densities in a layout of an integrated circuit (IC) according to an embodiment of the invention, wherein the method of FIG. 2 is performed by a computer capable of operating an electronic design automation (EDA) tool. First, in step S210, a processor of the computer obtains an initial placement of the IC, and the initial placement can be displayed in a graphical user interface (GUI). Next, the processor performs a cell density pre-processing according to an initial cell density distribution in the initial placement (step S220), so as to flatten the initial cell density distribution by inserting white space into the initial placement, and then obtain a flat cell density distribution. Next, in step S230, the processor obtains a routing density distribution in the initial placement of the IC, and identifies at least one routing congestion region according to the routing density distribution. In one embodiment, the sequence of the steps S220 and S230 can be exchanged. Next, in step S240, the processor redistributes the cell densities of the flat cell density distribution by increasing additional cell densities in the routing congestion regions, so as to obtain a modified cell density distribution. Next, in step 250, the processor performs a cell inflation and deflation calibration procedure according to the modified cell density distribution, so as to adjust cell sizes of cells according to the modified cell density distribution. For example, the processor may expand cell sizes of cells in a high routing density and low cell density region of the modified cell density distribution, and may shrink cell sizes of cells in the regions outside the high routing density and low cell density region. Next, in step S260, the processor performs the APR procedure again according to the cells with the adjusted cell size, so as to obtain a calibration placement. Next, in step S270, the processor recovers the cell sizes of the cells in the calibration placement and removes the white space from the calibration placement, so as to obtain a new placement, wherein a layout area of the new placement is smaller than a layout area of the initial placement. If the new placement is a legalization placement, for example, the Design Rule Checking (DRC) and Layout Versus Schematic (LVS) verifications are normal for the new placement, the new placement is a final placement that is used to implement the IC.

Figure 3:
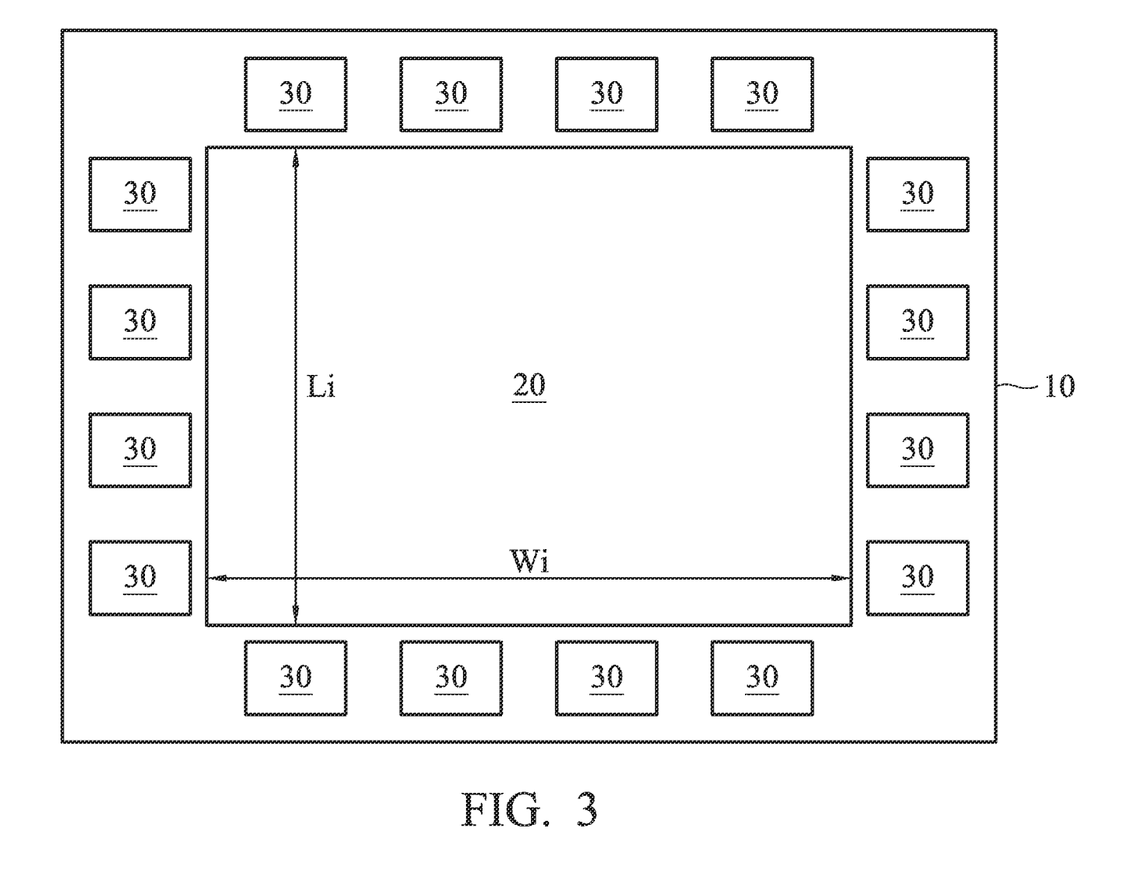
FIG. 3 shows an example of an initial placement according to step S210 of FIG. 2.
Figure 4:
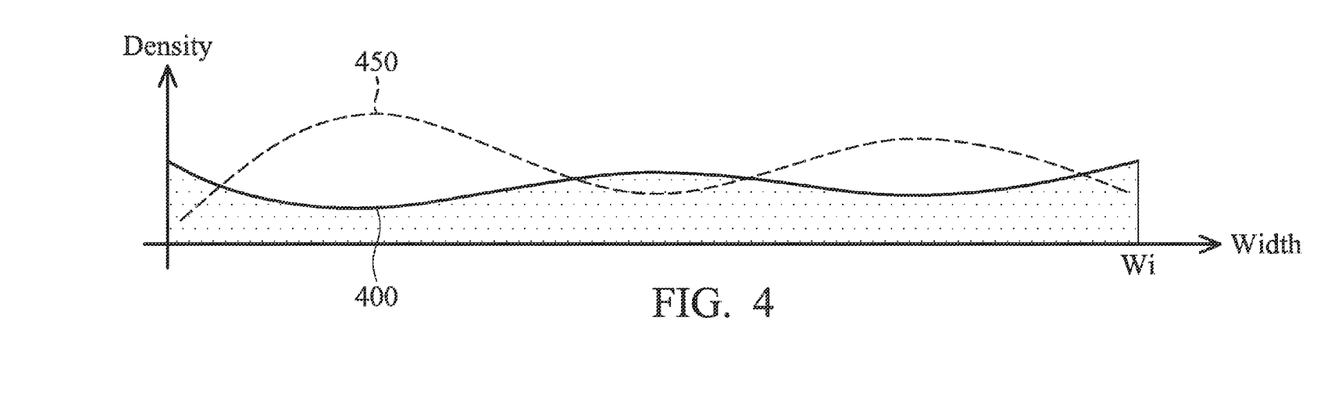
FIG. 4 shows an example of an initial cell density distribution in the initial placement of FIG. 3.

FIG. 3 shows an example of an initial placement 10 according to step S210 of FIG. 2. The initial placement 10 comprises a routing area 20 and a plurality of macro modules 30. The macro modules 30 may be the same or different modules, and the macro modules 30 are arranged around the routing area 20. The routing area 20 is formed by a plurality of cells (e.g. various types of standard cells) and a plurality of routing wires for connecting the cells and the macro modules 30. FIG. 4 shows an example of an initial cell density distribution in the initial placement 10 of FIG. 3. In FIG. 4, label 400 represents an initial cell density distribution obtained by the processor from the initial placement 10 of FIG. 3. Furthermore, a horizontal axle of the cell density distribution represents a width or length position of the routing area 20, and a vertical axle of the cell density distribution represents a cell density corresponding to a position in the horizontal axle. In the embodiment, assuming that a length of the routing area 20 is Li and a width of the routing area 20 is Wi in the initial placement 10, and the horizontal axle of the cell density distribution represents the width position of the routing area 20. Furthermore, in FIG. 4, label 450 represents a routing density distribution in the initial placement of the IC obtained in step S230 of FIG. 2.

Figure 5:
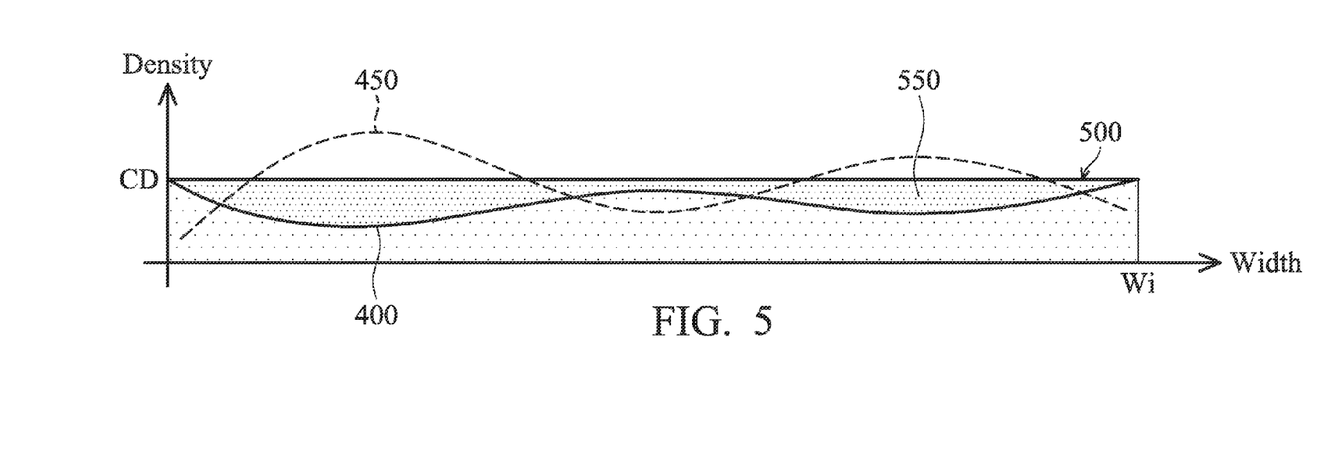
FIG. 5 shows an example of a flat cell density distribution obtained in step S220 of FIG. 2.

FIG. 5 shows an example of a flat cell density distribution obtained in step S220 of FIG. 2. In the embodiment, the white space is inserted into the initial placement 10 according to a specific density value CD, so as to obtain a flat cell density distribution 500. In FIG. 5, by inserting the white space 550, the initial cell density distribution 400 is filled to the specific density value CD, and then the processor can obtain the flat cell density distribution 500. It is to be noted that the specific density value CD is larger than a maximum cell density value of the initial cell density distribution 400.

Figure 6:
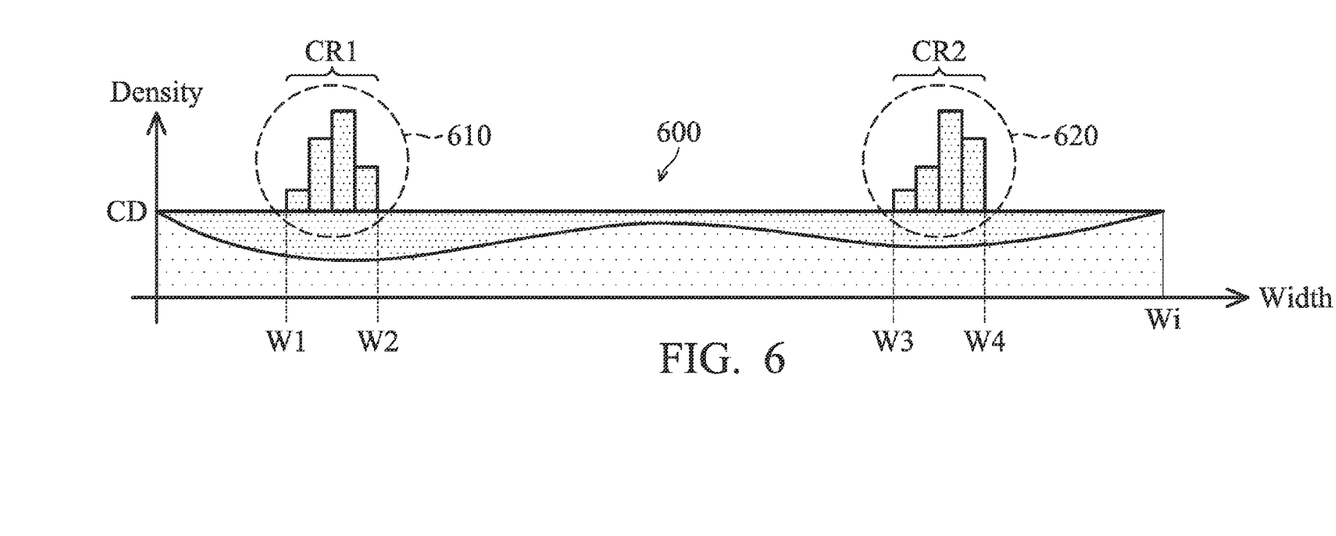
FIG. 6 shows an example of a modified cell density distribution obtained in step S240 of FIG. 2.

FIG. 6 shows an example of a modified cell density distribution obtained in step S240 of FIG. 2. In the embodiment, the processor can identify that a first routing congestion region CR1 exists between the positions W1 and W2, and a second routing congestion region CR2 exists between the positions W3 and W4. After the routing congestion regions CR1 and CR2 are identified, the processor redistributes the cell densities of the flat cell density distribution by increasing additional cell densities (as showed in labels 610 and 620) in the routing congestion regions CR1 and CR2, so as to obtain a modified cell density distribution 600.

Figure 7:
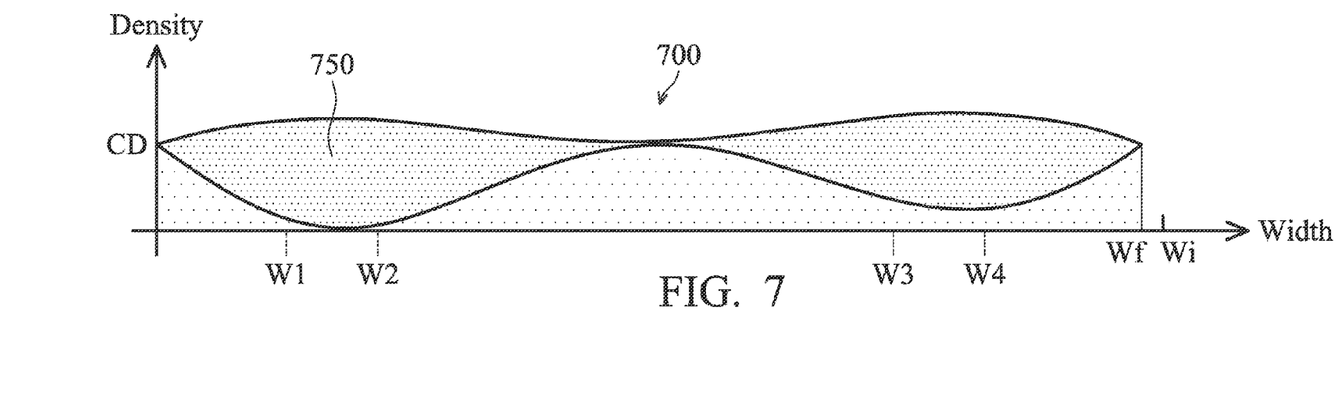
FIG. 7 shows an example of a calibration cell density distribution obtained in step S260 of FIG. 2.

FIG. 7 shows an example of a calibration cell density distribution obtained in step S260 of FIG. 2. In the embodiment, the cell sizes of cells located in the routing congestion regions CR1 and CR2 are expanded, and the cell sizes of the cells located in any region outside the routing congestion regions CR1 and CR2 are shrunk. Thus, after the APR procedure is performed again, the processor can obtain a calibration placement, i.e. the additional cell densities in the modified cell density distribution 600 are smoothed, wherein the calibration placement has a calibrated cell density distribution 700. In the embodiment, the width of a routing area corresponding to the calibration placement is Wf, wherein Wf is smaller than the width Wi of the routing area 20 in FIG. 3.

Figure 8:
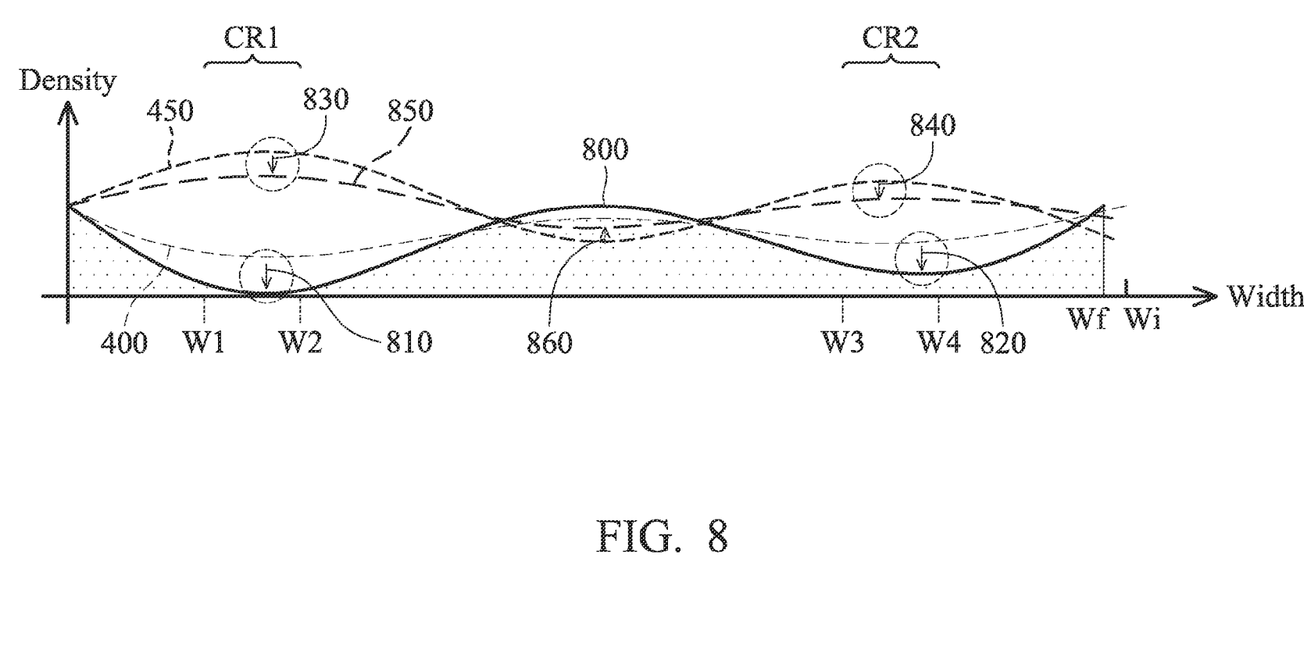
FIG. 8 shows an example of a final cell density distribution of a final placement obtained in step S270 of FIG. 2.

FIG. 8 shows an example of a final cell density distribution of a final placement obtained in step S270 of FIG. 2. Referring to FIG. 7 and FIG. 8 together, in the embodiment, the processor removes the white space 750 from the calibrated cell density distribution 700, so as to obtain a final placement 800. Furthermore, in FIG. 8, label 850 represents a final routing density distribution in the final placement 800 of the IC obtained in step S270 of FIG. 2. Thus, in the routing congestion region CR1, the cell density and the routing density of the final placement 800 are decreased, as shown in labels 810 and 830. Similarly, in the routing congestion region CR2, the cell density and the routing density of the final placement 800 are also decreased, as shown in labels 820 and 840. Furthermore, after obtaining the final placement 800 of the routing area in the IC (e.g. 20 of FIG. 3), the processor will again dispose the macro modules (e.g. 30 of FIG. 3) adjacent to the decreased routing area, thereby the layout area of the IC is decreased. Moreover, the maximum cell density in the initial placement is smaller than the maximum cell density in the final placement, as shown in label 860. Furthermore, the minimum routing density in the initial placement is smaller than the minimum routing density in the final placement, as shown in label 870.

Figure 9:
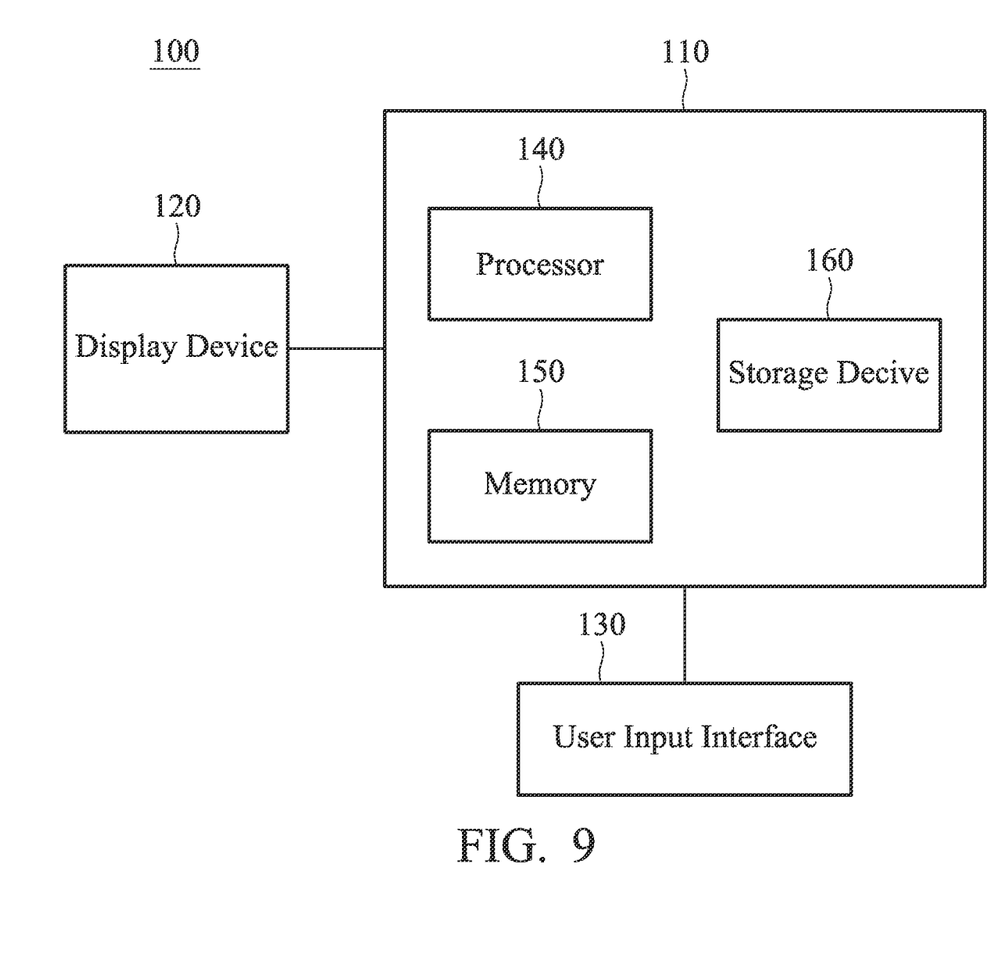
FIG. 9 shows a computer system 100 according to an embodiment of the invention.

FIG. 9 shows a computer system 100 according to an embodiment of the invention. The computer system 100 comprises a computer 110, a display device 120 and a user input interface 130, wherein the computer 110 comprises a processor 140, a memory 150, and a storage device 160. The computer 110 is coupled to the display device 120 and the user input interface 130, wherein the computer 110 is capable of operating an electronic design automation (EDA) tool. Furthermore, the computer 110 is capable of receiving input instructions from the user input interface 130 and displaying the placement and routing of the IC on the display device 120. In one embodiment, the display device 120 is a GUI for the computer 110. Furthermore, the display device 120 and the user input interface 130 can be implemented in the computer 110. The user input interface 130 may be a keyboard, a mouse and so on. In the computer 110, the storage device 160 can store the operating systems (OSs), applications, and data comprising input required by the applications and/or output generated by applications. The processor 140 of the computer 110 can perform one or more operations (either automatically or with user input) in any method that is implicitly or explicitly described in this disclosure. For example, during operation, the processor 140 can load the applications of the storage device 160 into the memory 150, and then the applications can be used by a user to create, view, and/or edit a placement for a circuit design.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for redistributing cell densities in a layout area of an integrated circuit (IC), comprising:
obtaining an initial cell density distribution in an initial placement of the IC;
obtaining a routing density distribution in the initial placement of the IC;
inserting white space into the initial placement according to a specific density value, so as to flatten the initial cell density distribution to the specific density value and obtain a flat cell density distribution, wherein the specific density value is larger than a maximum cell density value within the initial cell density distribution;
increasing cell densities of a first region in the IC according to the routing density distribution and the flat cell density distribution, so as to obtain a modified cell density distribution;
smoothing the modified cell density distribution to obtain a calibrated cell density distribution; and
removing the white space from the calibrated cell density distribution to obtain a final placement, wherein the final placement is implemented in manufacturing the IC.

2. The method as claimed in claim 1, wherein a cell density of the first region corresponding to the initial placement is larger than a cell density of the first region corresponding to the final placement.

3. The method as claimed in claim 1, wherein a routing density of the first region corresponding to the initial placement is larger than a routing density of the first region corresponding to the final placement.

4. The method as claimed in claim 1, wherein the first region corresponding to the initial placement is a routing congestion region in the routing density distribution, and the routing congestion region corresponds to a low cell density region in the initial cell density distribution.

5. The method as claimed in claim 1, wherein a layout area of the final placement is smaller than a layout area of the initial placement.

6. The method as claimed in claim 1, wherein the step of increasing the cell densities of the first region in the IC further comprises:
expanding cell sizes of cells in the first region; and
shrinking cell sizes of cells in a second region outside the first region.

7. The method as claimed in claim 6, wherein a maximum cell density in the initial placement is smaller than a maximum cell density in the final placement.

8. The method as claimed in claim 6, wherein a minimum routing density in the initial placement is smaller than a minimum routing density in the final placement.

9. The method as claimed in claim 6, wherein the first region is a region with low cell density and high routing density in the IC.

10. A non-transitory computer-readable storage medium storing instructions that, when executed by a computer, cause the computer to perform a method for redistributing cell densities in a layout area of an integrated circuit (IC), the method comprising:
obtaining an initial cell density distribution in an initial placement of the IC;
obtaining a routing density distribution corresponding to the initial cell density distribution;
inserting white space into the initial placement according to a specific density value, so as to flatten the initial cell density distribution to the specific density value and obtain a flat cell density distribution, wherein the specific density value is larger than a maximum cell density value within the cell density distribution;
increasing cell densities of a first region in the IC according to the routing density distribution and the flat cell density distribution, so as to obtain a modified cell density distribution;
smoothing the modified cell density distribution to obtain a calibrated cell density distribution; and
removing the white space from the calibrated cell density distribution to obtain a final placement, wherein the final placement is implemented in manufacturing the IC.

11. The non-transitory computer-readable storage medium as claimed in claim 10, wherein a cell density of the first region corresponding to the initial placement is larger than a cell density of the first region corresponding to the final placement, and a routing density of the first region corresponding to the initial placement is larger than a routing density of the first region corresponding to the final placement.

12. The non-transitory computer-readable storage medium as claimed in claim 10, wherein the first region corresponding to the initial placement is a routing congestion region in the routing density distribution, and the routing congestion region corresponds to a low cell density region in the initial cell density distribution.

13. The non-transitory computer-readable storage medium as claimed in claim 10, wherein a layout area of the final placement is smaller than a layout area of the initial placement.

14. The non-transitory computer-readable storage medium as claimed in claim 10, wherein the step of increasing the cell densities of the first region in the IC further comprises:
expanding cell sizes of cells in the first region; and
shrinking cell sizes of cells in a second region outside the first region.

15. The non-transitory computer-readable storage medium as claimed in claim 14, wherein a maximum cell density in the initial placement is smaller than a maximum cell density in the final placement, and a minimum routing density in the initial placement is smaller than a minimum routing density in the final placement.

16. The non-transitory computer-readable storage medium as claimed in claim 14, wherein the first region is region with low cell density and high routing density in the IC.

* * * * *